(12) United States Patent
Yano (10) Patent No.: US 8,466,474 B2
(45) Date of Patent: Jun. 18, 2013

(54) SILICON CARBIDE SEMICONDUCTOR DEVICE AND METHOD OF PRODUCING SILICON CARBIDE SEMICONDUCTOR DEVICE

(75) Inventor: Kotaro Yano, Kawasaki (JP)

(73) Assignee: Showa Denko K.K., Tokyo (JP)

( * ) Notice: Subject to any disclaimer, the term of this patent is extended or adjusted under 35 U.S.C. 154(b) by 9 days.

(21) Appl. No.: 13/143,218

(22) PCT Filed: Nov. 30, 2009

(86) PCT No.: PCT/JP2009/006469
§ 371 (c)(1),
(2), (4) Date: Jul. 5, 2011

(87) PCT Pub. No.: WO2010/082264
PCT Pub. Date: Jul. 22, 2010

(65) Prior Publication Data
US 2011/0266558 A1 Nov. 3, 2011

(30) Foreign Application Priority Data
Jan. 15, 2009 (JP) ................................. 2009-006627

(51) Int. Cl.
*H01L 29/15* (2006.01)
(52) U.S. Cl.
USPC ..................................... 257/77; 257/E21.054
(58) Field of Classification Search
USPC .............. 257/77, E21.054, E21.055, E21.065
See application file for complete search history.

(56) References Cited

U.S. PATENT DOCUMENTS

| 4,990,994 A | | 2/1991 | Furukawa et al. | |
|---|---|---|---|---|
| 5,323,022 A | * | 6/1994 | Glass et al. | 257/77 |
| 6,043,513 A | * | 3/2000 | Kronlund | 257/77 |

FOREIGN PATENT DOCUMENTS

| JP | 62-71271 A | 4/1987 |
|---|---|---|
| JP | 1-268121 A | 10/1989 |
| JP | 2-196421 A | 8/1990 |
| JP | 2509713 B2 | 6/1996 |
| JP | 2002-16017 A | 1/2002 |
| JP | 2002-75909 A | 3/2002 |
| WO | 2008035822 A1 | 3/2008 |
| WO | 2008/114838 A1 | 9/2008 |

OTHER PUBLICATIONS

Jayant B. Baliga, "Analysis of a High-Voltage Merged p-i-n/Schottky (MPS) Rectifier", IEEE Electron Device Letters, Sep. 1987, pp. 407-409 vol. EDL8, No. 9.
K.V. Vasilevskii, et al., "Electrical characteristics and structural properties of ohmic contacts to *p*-type 4*H*-SiC epitaxial layers", Semiconductors, Nov. 1999, pp. 1206-1211, vol. 33, No. 11.
O. Nennewitz, et al., "Ohmic contacts to p-type 6H-silicon carbide", Applied Surface Science 91, 1995, pp. 347-351.

(Continued)

*Primary Examiner* — Brook Kebede
(74) *Attorney, Agent, or Firm* — Sughrue Mion, PLLC (57) ABSTRACT

There is provided a silicon carbide semiconductor device equipped with an ohmic electrode that exhibits both low contact resistance and favorable surface conditions, the silicon carbide semiconductor device including a p-type silicon carbide single crystal, and an ohmic electrode for the p-type silicon carbide single crystal, wherein the ohmic electrode includes an alloy layer containing at least titanium, aluminum and silicon, and ratios of titanium, aluminum, and silicon in the alloy layer are Al: 40 to 70% by mass, Ti: 20 to 50% by mass, and Si: 1 to 15% by mass.

3 Claims, 7 Drawing Sheets

OTHER PUBLICATIONS

Satoshi Tanimoto, et al., "Practical Device-Directed Ohmic Contacts on 4H-SiC", The Institute of Electronics, Information and Communication Engineers, Apr. 2003, pp. 359-367, vol. J86-C, No. 4.

Satoshi Tanimoto, "Ohmic Contact Fabrication Technology for SiC Power Devices", The Journal of the Surface Finishing Society of Japan, 2004, pp. 29-32, vol. 55, No. 1.

A.N. Andreev, et al.; "High Temperature Ti-Al-Based Ohmic Contacts to P-6H-SiC"; Proceedings of the International Semiconductor Conference, CAS 1998 IEEE; vol. 1; 1998; pp. 311-314; XP002686155.

Hui Guo, et al.; "Ti-Al based ohmic contacts to n-type 6H-SiC with $P^+$ ion implantation"; Chinese Physics; vol. 15, No. 9; Sep. 2006; pp. 2142-2145; XP20106356.

Hui Guo, et al.; "Fabrication of Ti-Al Ohmic Contacts to N-type 6H-SiC with $P^+$ Ion"; International Workshop on Junction Technology; Shanghai, China; May 15-16, 2006; pp. 265-267; XP010934743.

B. Pécz, et al.; "$Ti_3SiC_2$ formed in annealed Al/Ti contacts to p-type SiC"; Applied Surface Science; vol. 206, No. 1-4; Feb. 15, 2003; pp. 8-11; XP002462221.

M. Gao, et al.; "Role of Interface Layers and Localized States in TiAl-Based Ohmic Contacts to p-Type 4H-SiC"; Journal of Electronic Materials; vol. 36, No. 4; Apr. 1, 2007; pp. 277-284; XP002462222.

L. Kolaklieva, et al.; "Au/Ti/Al Contacts to SiC for Power Applications: Electrical, Chemical and Thermal Properties"; 4th International Conference on Microelectronics—MIEL 2004; vol. 2; 2004; pp. 421-424; XP002686156.

European Search Report dated Dec. 12, 2012 for corresponding European Patent Application No. EP 09 83 8234.

Hui Guo, et al.; "Fabrication of Ti-Al Ohmic Contacts to N-type 6H-SiC with P+ Ion Implantation"; International Workshop on Junction Technology; Shanghai, China; May 15-16, 2006; pp. 265-267; XP010934743.

\* cited by examiner

SILICON CARBIDE SEMICONDUCTOR DEVICE AND METHOD OF PRODUCING SILICON CARBIDE SEMICONDUCTOR DEVICE

TECHNICAL FIELD

The present invention relates to a silicon carbide semiconductor device, and also relates to a method of producing a silicon carbide semiconductor device.

Priority is claimed on Japanese Patent Application No. 2009-006627, filed Jan. 15, 2009, the content of which is incorporated herein by reference.

BACKGROUND ART

Silicon carbide semiconductors exhibit higher dielectric breakdown voltages than those of silicon semiconductors as well as wide energy band gaps, and also have various excellent properties such as high thermal conductivity, and therefore their applications for light emitting devices, high power devices, high-temperature resistant devices, radiation resistant devices, high frequency devices, and the like have been expected.

In addition, silicon carbide semiconductors have been applied to Schottky barrier diodes. These silicon carbide (SiC) Schottky barrier diodes have conventionally been known to cause device breakdown even at a relatively low surge current when the surge current flows in the forward direction.

Thus, in order to solve this problem, a device structure in which n-type regions and p-type regions are arranged in parallel on one surface of a SiC semiconductor device so that the injection of holes that are minority carriers occurs from the p-type regions at the time of high current conduction has been proposed (for example, refer to Non-Patent Document 1). When such device structures are prepared, the surge resistance can be improved. Such device structures are known as a merged p-i-n Schottky (MPS) structure.

In the MPS structure, Schottky diodes and pn-type diodes are arranged alternately on one surface of a semiconductor device. Accordingly, on one surface of a semiconductor device, it is necessary to provide a junction layer constituted of a junction material that forms a favorable Schottky junction with an n-type semiconductor region and also forms a favorable ohmic junction with a p-type semiconductor region.

Incidentally, an aluminum-titanium (Al—Ti) alloy has been known as one of the metals to form an ohmic electrode with respect to p-type silicon carbide. In addition, it is accepted that an annealing process at a high temperature of 1,000° C. or higher is generally required in order to form an ohmic electrode having a low resistance. However, when an annealing process is carried out at a high temperature using titanium and aluminum, roughening of the surface electrode has been a problem.

Accordingly, a method of forming a p-type ohmic electrode using titanium and aluminum without an annealing process at high temperatures has been disclosed (for example, refer to Patent Document 1 or 2). More specifically, in Patent Document 1, a titanium-aluminum alloy (with no silicon (Si) included) characterized by exhibiting strong adhesion to a SiC single crystal that is serving as a base without undergoing a heat treatment has been described. Further, in Patent Document 2, a titanium-aluminum alloy (n-type SiC in Examples) interposed with a thin film composed of titanium carbide has been described. Both of these methods are capable of forming ohmic junctions at low temperatures without the requirement for a heat treatment at high temperatures.

CITATION LIST

Patent Document

[Patent Document 1] Japanese Patent No. 2509713
[Patent Document 2] Japanese Unexamined Patent Application, First Publication No. 2002-16017

Non-Patent Document

[Non-Patent Document 1] IEEE Electron Device Letters Vol. EDL8 No. 9, 1987, p. 407-409

SUMMARY OF INVENTION

Technical Problem

However, the silicon carbide semiconductor devices described in Patent Documents 1 and 2 suffer from a problem in that ohmic electrodes with a low contact resistance have been difficult to achieve in those cases where no annealing process is conducted during the formation of ohmic electrodes. Accordingly, in order to form an ohmic electrode with low contact resistance when using titanium and aluminum, it becomes necessary to conduct a high-temperature annealing process at a certain temperature. However, in such cases, titanium and aluminum react with silicon carbide, thereby forming alloys with different compositions from those of deposited metals. For this reason, the conditions for stably forming ohmic electrodes exhibiting both low contact resistance and favorable surface conditions have not been established.

The present invention takes the above circumstances into consideration, with an object of providing a silicon carbide semiconductor device equipped with an ohmic electrode that exhibits both low contact resistance and favorable surface conditions.

In addition, the present invention has an object of providing a method of producing a silicon carbide semiconductor device which is capable of stably forming an ohmic electrode exhibiting both low contact resistance and favorable surface conditions.

Solution to Problem

The inventors of the present invention have conducted intensive and extensive studies on the conditions for stably forming ohmic electrodes exhibiting both low contact resistance and favorable surface conditions, and discovered that superior p-type ohmic electrodes can be obtained by controlling the deposition and annealing conditions using the electrode structure, especially the alloy composition, as an indicator. In other words, the inventors of the present invention have discovered that by preparing an ohmic electrode with a ternary alloy composed of titanium-aluminum-silicon, laminating titanium followed by aluminum, and setting the temperature for the heat treatment at 880 to 930° C., which is lower than the usual temperature of 1,000° C., films having an optimal composition can be obtained, and they consequently completed the present invention.

That is, the present invention relates to the aspects described below.

(1) A silicon carbide semiconductor device characterized by having a p-type silicon carbide single crystal and an ohmic electrode for the p-type silicon carbide single crystal, in which the ohmic electrode includes an alloy layer containing at least titanium, aluminum and silicon, and ratios of titanium, aluminum, and silicon in the alloy layer are Al: 40 to 70% by mass, Ti: 20 to 50% by mass, and Si: 1 to 15% by mass.

(2) The silicon carbide semiconductor device according to the above aspect (1) characterized in that the alloy layer includes a two-layer structure constituted of a first alloy layer provided on the p-type silicon carbide single crystal side and a second alloy layer provided on the side opposite to the p-type silicon carbide single crystal while being interposed by the first alloy layer, and ratios of titanium, aluminum, and silicon in the second alloy layer are Al: 40 to 70% by mass, Ti: 20 to 50% by mass, and Si: 1 to 15% by mass.

(3) The silicon carbide semiconductor device according to the above aspect (2) characterized in that the concentration of silicon in the first alloy layer is higher than the concentration of silicon in the second alloy layer.

(4) The silicon carbide semiconductor device according to any one of the above aspects (1) to (3) characterized in that the alloy layer is formed by laminating titanium on top of the silicon carbide single crystal in a layered manner, and then laminating aluminum thereon in a layered manner, followed by alloying through a heat treatment.

(5) The silicon carbide semiconductor device according to the above aspect (4) characterized in that the heat treatment is conducted at a temperature between 880 and 930° C. and within a time of 5 minutes.

(6) A method of producing a silicon carbide semiconductor device characterized by having: a step of laminating titanium on top of a silicon carbide single crystal in a layered manner; a step of laminating aluminum, in a layered manner, on the titanium laminated in a layered manner; and a step of alloying through a heat treatment, and in which the heat treatment is conducted at a temperature between 880 and 930° C. and within a time of 5 minutes.

ADVANTAGEOUS EFFECTS OF INVENTION

The silicon carbide semiconductor device of the present invention is configured so that an ohmic electrode includes an alloy layer containing at least titanium, aluminum and silicon. In addition, this alloy layer has an optimal composition consisting of 40 to 70% by mass of Al, 20 to 50% by mass of Ti and 1 to 15% by mass of Si. For this reason, an ohmic electrode having a low contact resistance and a smooth electrode surface can be provided. Accordingly, even when a treatment using hydrofluoric acid is conducted following the formation of ohmic electrodes, a silicon carbide semiconductor device, in which a compact electrode with no gaps within the electrode has been formed, can be provided.

The method of forming a silicon carbide semiconductor device according to the present invention is configured so that titanium is laminated in a layered manner, followed by lamination of aluminum in a layered manner. In addition, it is configured so that a treatment is conducted for 5 minutes at a temperature of 880 to 930° C., which is lower than the usual heat treatment temperature of 1,000° C. for forming ohmic electrodes. In this manner, by specifying the lamination order and heat treatment conditions as described above, ohmic electrodes with a desired composition can be formed. Accordingly, a silicon carbide semiconductor device equipped with an ohmic electrode that has a low contact resistance and a smooth electrode surface can be stably produced.

DESCRIPTION OF EMBODIMENTS

A silicon carbide semiconductor device which is an embodiment where the present invention is applied as well as a production method thereof will be described below in detail with reference to the drawings. Here, an explanation is provided by employing a Schottky barrier diode in which a PN junction and a Schottky junction region are conjugated as an example of a silicon carbide semiconductor device. It should be noted that those drawings used in the following explanation are showing characteristic portions enlarged in some cases for the sake of simplicity, and thus the size and ratio of each component does not necessarily reflect the actual size and ratio thereof.

Figure 1:
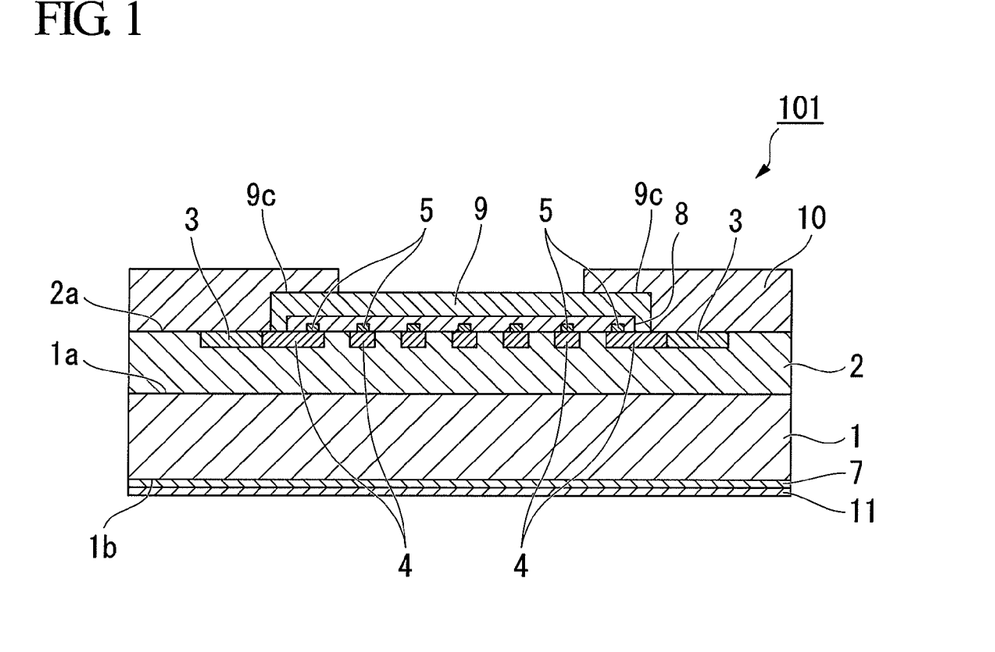
FIG. 1 is a schematic cross sectional view of a Schottky barrier diode, which is an embodiment where the present invention is applied.

FIG. 1 is a schematic cross sectional view of a Schottky barrier diode, which is an embodiment where the present invention is applied. As shown in FIG. 1, a Schottky barrier diode 101 of the present embodiment is mainly configured by having a SiC single crystal substrate 1; an N-type epitaxial layer 2 formed on a surface 1a of the SiC single crystal substrate 1; P-type impurity regions 3 and 4 constituted of fine patterns formed on a surface 2a of the N-type epitaxial layer 2; a front surface ohmic contact electrode (ohmic electrode) 5 formed on top of the P-type impurity region (P-type silicon carbide single crystal) 4; a Schottky metallic portion 8 that is connected to the P-type impurity regions 3 and 4 as well as to the front surface ohmic contact electrode 5; a front surface pad electrode 9 that is formed so as to cover the Schottky metallic portion 8; a back surface ohmic contact electrode 7 that is formed on a back surface 1b of the SiC single crystal substrate 1; and a back surface pad electrode 11 that is formed so as to cover the back surface ohmic contact electrode 7.

The SiC single crystal substrate 1 is a 4H—SiC substrate. In addition, the plane orientation is a C-plane and an off angle may be provided. Furthermore, a Si-face may be used or a C-face may be used. This SiC single crystal substrate 1 is prepared as an N-type semiconductor substrate doped with a high concentration of N-type impurities.

The N-type epitaxial layer 2 is formed on top of the SiC single crystal substrate 1, and a plurality of P-type impurity regions 3 and 4 are formed in the N-type epitaxial layer 2. As a result, a PN junction region is formed at the interface between the P-type impurity regions 3 and 4 and the N-type epitaxial layer 2, thereby improving the rectifying properties of the Schottky barrier diode 101. It should be noted that the P-type impurity regions 3 and 4 may be provided in the N-type epitaxial layer 2 or may be provided in the SiC single crystal substrate 1. In addition, the leak current can be reduced by narrowing the spacing between the aforementioned PN junction regions.

It should be noted that as described later in the section for explaining the method of producing a Schottky barrier diode, the P-type impurity regions 3 and 4 are prepared in such a manner that they can be differentiated into a low-concentration P-type impurity region 3 and a high-concentration P-type impurity region 4, based on the difference in the concentrations of P-type impurities. In addition, the P-type impurity regions 3 and 4 may be formed through epitaxial growth.

Figure 2:
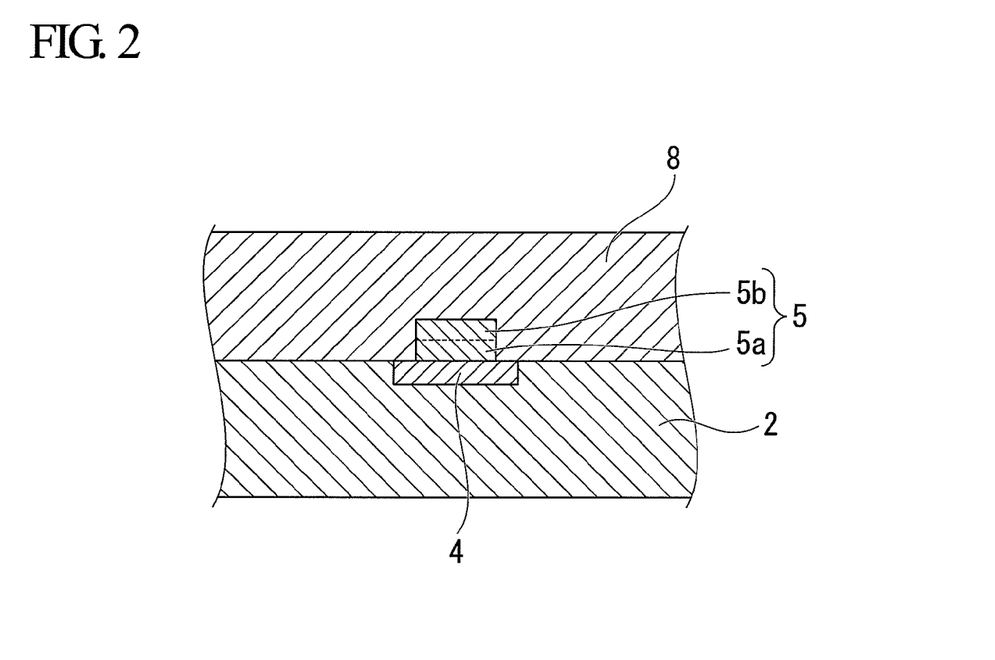
FIG. 2 is a cross sectional view that enlarges the periphery of a front surface ohmic contact electrode in a Schottky barrier diode according to the present embodiment.

FIG. 2 is an enlarged view of the periphery of the front surface ohmic contact electrode 5. As shown in FIG. 2, the front surface ohmic contact electrode 5 includes a two-layer structure constituted of a first alloy layer 5a provided on the P-type impurity region 4 side and a second alloy layer 5b provided on the side opposite to the P-type impurity region 4 while being interposed by the first alloy layer 5a. Note that the front surface ohmic contact electrode 5 where the two-layer structure is observed during the cross sectional observation of electrodes is prepared as an electrode exhibiting superior ohmic properties as well as favorable surface conditions. As described later in the section for explaining the method of producing a Schottky barrier diode, this is related to the order of aluminum lamination following the deposition of titanium in the formation of the front surface ohmic contact electrode 5. Accordingly, when the order of lamination is different from the one described above, these layers are not observed clearly.

Note that the boundary between the first alloy layer 5a and the second alloy layer can be determined from the boundary of images with different contrasts when the cross section is observed using an electron microscope.

The front surface ohmic contact electrode 5 is a ternary alloy layer containing at least titanium, aluminum and silicon. Further, ratios of titanium, aluminum, and silicon in this alloy layer are preferably such that the aluminum (Al) content be 40 to 70% by mass, the titanium (Ti) content be 20 to 50% by mass, and the silicon (Si) content be 1 to 15% by mass. When the aluminum content is less than 40% by mass, it is undesirable because the layer does not exhibit ohmic properties. On the other hand, when the aluminum content exceeds 70% by mass, it is undesirable because excess aluminum forms a liquid phase and is scattered about to react with a protective film made of $SiO_2$ or the like. In addition, when the Ti content is less than 20% by mass, it is undesirable because excess aluminum is scattered about to react with a $SiO_2$ protective film. On the other hand, when the Ti content exceeds 50% by mass, it is undesirable because the layer does not exhibit ohmic properties. Furthermore, when the silicon content is less than 1% by mass, it is undesirable because the contact resistance increases. On the other hand, when the silicon content exceeds 15% by mass, it is undesirable because the layer does not exhibit ohmic properties.

Note that the silicon concentrations in the first alloy layer 5a and the second alloy layer 5b are clearly different. In other words, it has been confirmed that the concentration distribution of silicon rapidly changes at the boundary between the first alloy layer 5a and the second alloy layer 5b. In addition, no steep concentration gradient is observed in the composition of each of the first alloy layer 5a and the second alloy layer 5b, and a relatively uniform concentration distribution is observed within each layers.

Since the first alloy layer 5a has a low layer thickness, it is difficult to conduct an accurate, quantitative composition analysis through techniques such as EDX. However, the composition thereof is such that the silicon content is high, as compared to the second alloy layer 5b. In addition, as described later in the section for explaining the method of producing a Schottky barrier diode, since Ti is laminated first and Al is laminated after that, it is assumed that the Ti content is higher than the Al content with regard to the layer composition. Furthermore, the first alloy layer 5a is characterized in that the Si content is high, as compared to the second alloy layer 5b. Note that when the first alloy layer 5a is present (in those cases where the presence is confirmed by the cross sectional observation), a flat surface with favorable surface conditions can be achieved for the front surface ohmic contact electrode 5. On the other hand, when the first alloy layer 5a is absent (in those cases where the presence cannot be confirmed by the cross sectional observation), the front surface ohmic contact electrode 5 tends to have a rough surface.

The second alloy layer 5b is closely related to the characteristics of the front surface ohmic contact electrode 5. That is, the composition of the second alloy layer 5b is preferably such that ratios of titanium, aluminum, and silicon become the same as described above. In addition, the layer thickness of the second alloy layer 5b is preferably 10 to 500 nm, more preferably 100 to 300 nm, and most preferably 100 to 200 nm. If the layer thickness of the second alloy layer 5b is less than 10 nm, it becomes difficult to form a film continuously, which is undesirable, whereas the layer thickness exceeding 500 nm is undesirable since the layer may be detached.

On the other hand, the layer thickness within the above-mentioned range is preferred since a continuous film can be formed without detachment.

As shown in FIG. 1, a Schottky barrier developed as a result of the junction of a metal and a semiconductor is formed at the interface between the P-type impurity region 4, the N-type epitaxial layer 2 and the Schottky metallic portion 8, thereby forming a Schottky junction region. As a result, the voltage drop for the Schottky barrier diode 101 in the forward direction can be reduced, and also the switching speed can be increased.

It should be noted that by increasing the proportion of area occupied by the aforementioned Schottky junction region within the electrode as a whole, the voltage drop can be reduced when a forward current is caused to flow, thereby reducing the extent of power loss.

A passivation film 10 is formed so as to cover an end portion 9c of the front surface pad electrode 9 and also to cover the entire surface 2a of the N-type epitaxial layer 2. The exposed portion of the front surface pad electrode 9 serves as a terminal junction portion.

For example, the Schottky barrier diode 101 is arranged when being installed in a wiring board (not shown) so that an aluminum wire bonding process is conducted so as to connect one terminal portion of the aforementioned wiring board and the aforementioned terminal junction portion, and also the back surface pad electrode 11 is bonded to the other terminal portion of the aforementioned wiring board. As a result, a voltage can be applied to the back surface pad electrode 11 and the front surface pad electrode 9 of the Schottky barrier diode 101.

Next, a method of producing the Schottky barrier diode 101 according to the embodiment of the present invention will be described. FIGS. 3 to 11 are cross sectional process drawings for describing an example of a method of producing the Schottky barrier diode 101 according to the present embodiment. Note that the same components as those shown in FIG. 1 and FIG. 2 are provided with the same reference numerals.

A method of producing the Schottky barrier diode 101 according to the present embodiment includes: a step of forming the P-type impurity regions 3 and 4 as well as the front surface ohmic contact electrode 5 on a surface 1a of the SiC single crystal substrate 1 (front surface ohmic contact electrode formation step); a step of forming a protective film 6 so as to cover the P-type impurity regions 3 and 4 as well as the front surface ohmic contact electrode 5, followed by planarization of the protective film 6 (protective film planarization step); a step of forming the back surface ohmic contact electrode 7 on the back surface 1b of the SiC single crystal substrate 1 (back surface ohmic contact electrode formation step); and a step of forming a Schottky metallic portion 8 that is connected to the P-type impurity regions 3 and 4 as well as to the front surface ohmic contact electrode 5, followed by formation of the front surface pad electrode 9 so as to cover the Schottky metallic portion 8 (front surface pad electrode formation step).

<Front Surface Ohmic Contact Electrode Formation Step>

Figure 3:
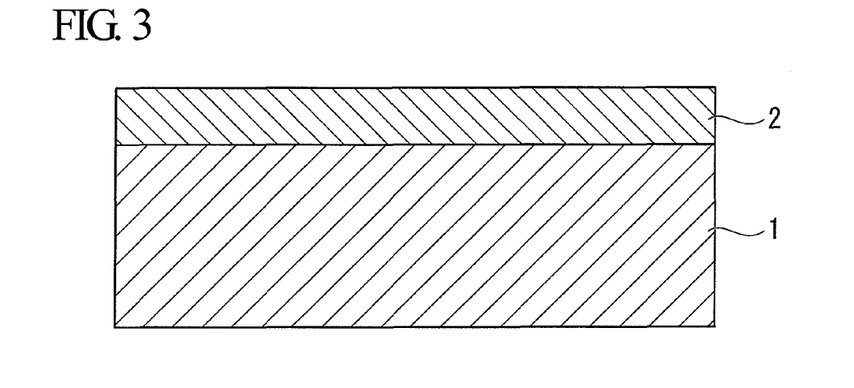
FIG. 3 is a cross sectional process drawing for describing a method of producing a Schottky barrier diode according to the present embodiment.

First, as shown in FIG. 3, the N-type epitaxial layer 2 is formed on top of the SiC single crystal substrate 1 (N-type semiconductor substrate).

Then, an oxide film is formed on top of the N-type epitaxial layer 2 by the chemical vapor deposition (CVD) method.

Subsequently, a resist is applied on top of the aforementioned oxide film, followed by formation of a photoresist pattern using a stepper. By using a stepper, a photoresist pattern constituted of fine patterns can be formed. Thereafter, the aforementioned oxide film is dry etched to form a window portion.

Then, ions of aluminum or boron serving as the P-type impurities are implanted into the N-type epitaxial layer 2 by using, as a mask, the aforementioned oxide film in which the window portion has been formed. Thereafter, a resist is applied onto the aforementioned oxide film once again, followed by formation of a photoresist pattern using a stepper. Subsequently, the aforementioned oxide film is dry etched to form a window portion. Then, ions of aluminum or boron serving as the P-type impurities are implanted into the N-type epitaxial layer 2 by using, as a mask, the aforementioned oxide film in which the window portion has been formed. Thereafter, the aforementioned oxide film is removed.

Then, a carbonized film (such as a carbon film) is formed on top of the N-type epitaxial layer 2 by a sputtering method.

Figure 4:
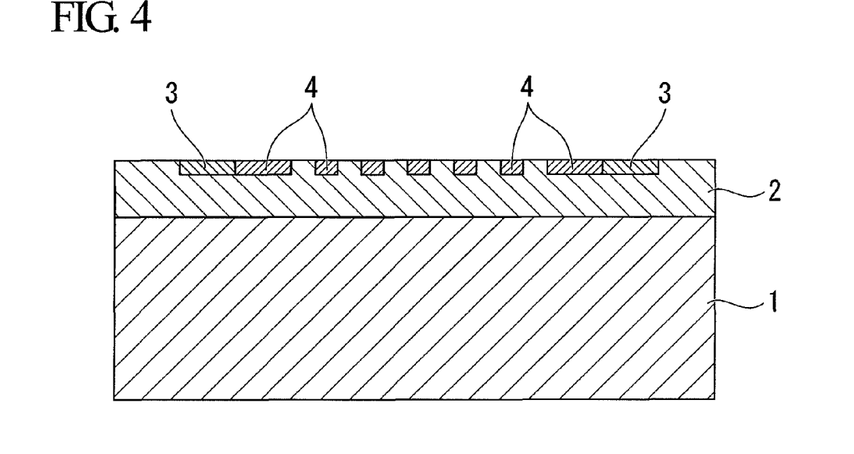
FIG. 4 is a cross sectional process drawing for describing a method of producing a Schottky barrier diode according to the present embodiment.

Thereafter, in order to activate the P-type impurities introduced by ion implantation, a heat treatment at a high temperature (for example, a heat treatment at 1,700° C.) is carried out in an inert gas atmosphere or in a vacuum. Thereafter, the aforementioned carbonized film is removed. As a result, the low-concentration P-type impurity region 3 and the high-concentration P-type impurity region 4 are formed.

Note that the aforementioned carbonized film may be formed by applying an organic material followed by a heat treatment, instead of the sputtering method.

FIG. 4 is a cross sectional process drawing showing a state at the point where the low-concentration P-type impurity region 3 and the high-concentration P-type impurity region 4 have been formed.

Next, the front surface ohmic contact electrode 5 is formed on top of the P-type impurity region 4. Formation of the front surface ohmic contact electrode 5 is mainly constituted of a step of laminating titanium in a layered manner on top of the N-type epitaxial layer 2 in which the P-type impurity regions 3 and 4 have been formed (titanium lamination step); a step of laminating aluminum in a layered manner above the aforementioned titanium laminated in a layered manner (aluminum lamination step); and a step of alloying through a heat treatment (heat treatment step).

(Titanium Lamination Step)

First, as a pretreatment, a substrate is subjected to RCA washing using, for example, sulfuric acid and hydrogen peroxide, ammonia and hydrogen peroxide, an aqueous hydrofluoric acid solution, hydrochloric acid and hydrogen peroxide, or an aqueous hydrofluoric acid solution.

Figure 5:
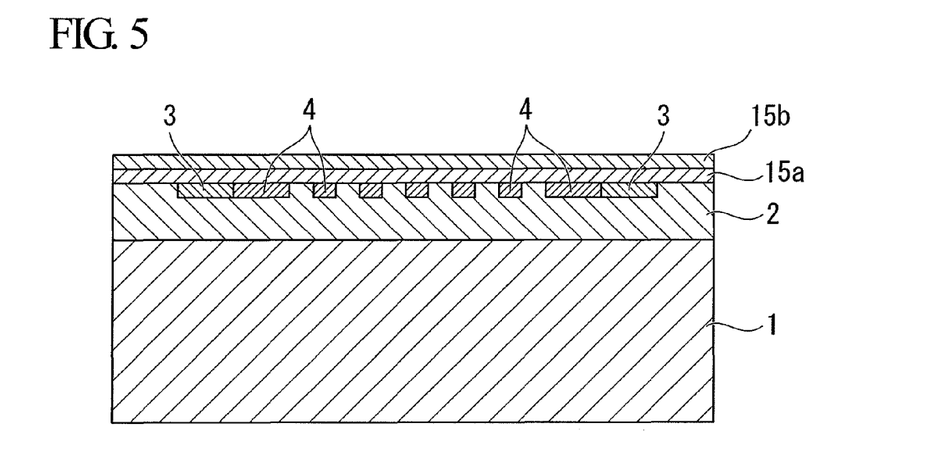
FIG. 5 is a cross sectional process drawing for describing a method of producing a Schottky barrier diode according to the present embodiment.

Then, as shown in FIG. 5, by employing a sputtering method or a deposition method, titanium is laminated in a layered manner on top of the N-type epitaxial layer 2 in which the P-type impurity regions 3 and 4 have been formed. As a result, a titanium layer 15a is formed.

(Aluminum Lamination Step)

Then, as shown in FIG. 5, by employing a sputtering method or a deposition method, aluminum is laminated in a layered manner on top of the titanium layer 15a. As a result, an aluminum layer 15b is formed.

Here, the thickness for the titanium layer 15a and the aluminum layer 15b is preferably 10 to 10000 Å, more preferably 100 to 1,000 Å, and most preferably 500 to 1,000 Å. When the thickness for the titanium layer 15a and the aluminum layer 15b is less than 10 Å, it is undesirable because electrode layers sufficient for achieving the ohmic junction cannot be formed. On the other hand, the thickness exceeding 10,000 Å may adversely affect the insulating films or the like nearby, which is undesirable.

In addition, the present embodiment is characterized by specifying the lamination order for titanium and aluminum as described above when forming the front surface ohmic contact electrode 5. Here, silicon (Si) is usually diffused from the SiC substrate, thereby becoming a constituent of an alloy for the front surface ohmic contact electrode 5. Note that silicon may be laminated by employing a sputtering method or a deposition method, prior to the Ti lamination.

(Heat Treatment Step)

Next, the laminated titanium layer 15a and aluminum layer 15b are alloyed through a heat treatment. An infrared lamp heating system (namely, a rapid thermal annealing (RTA) system) or the like can be employed for the heat treatment. The degree of vacuum for the system is preferably as low as possible, and more preferably not more than $3 \times 10^{-4}$ Pa. First, the layers are heated from room temperature to 100° C. in order to remove the surface moisture and to improve the adhesion of layers, and then the temperature is raised to a heat treatment temperature. The heat treatment temperature is preferably 880 to 930° C., and more preferably 890 to 910° C. When the heat treatment temperature is less than 880° C., it is undesirable because the alloying reaction does not proceed satisfactorily. On the other hand, when the heat treatment temperature exceeds 930° C., it is undesirable because it becomes difficult to control the diffusion, and thus a desired alloy composition cannot be achieved. In addition, the heat treatment time is preferably 1 to 5 minutes, and more preferably 1 to 3 minutes. When the heat treatment time is less than 1 minute, it is undesirable because the alloying reaction does not proceed satisfactorily. On the other hand, when the heat treatment time exceeds 5 minutes, it is undesirable because the reaction with the substrate proceeds too much to roughen the electrode surface. It should be noted that the heat treatment is preferably conducted in an inert gas atmosphere, and more preferably in an argon atmosphere. As a result, a ternary alloy film composed of titanium, aluminum and silicon is formed.

Subsequently, a resist is applied on top of the aforementioned alloy film, followed by formation of a photoresist pattern using a stepper. By using a stepper, a photoresist pattern constituted of fine patterns can be formed. Thereafter, the aforementioned metal film is dry etched to form the front surface ohmic contact electrode 5. The front surface ohmic contact electrode 5 is connected to a plurality of high-concentration P-type impurity regions 4 to form an ohmic contact.

<Protective Film Planarization Step>

Figure 6:
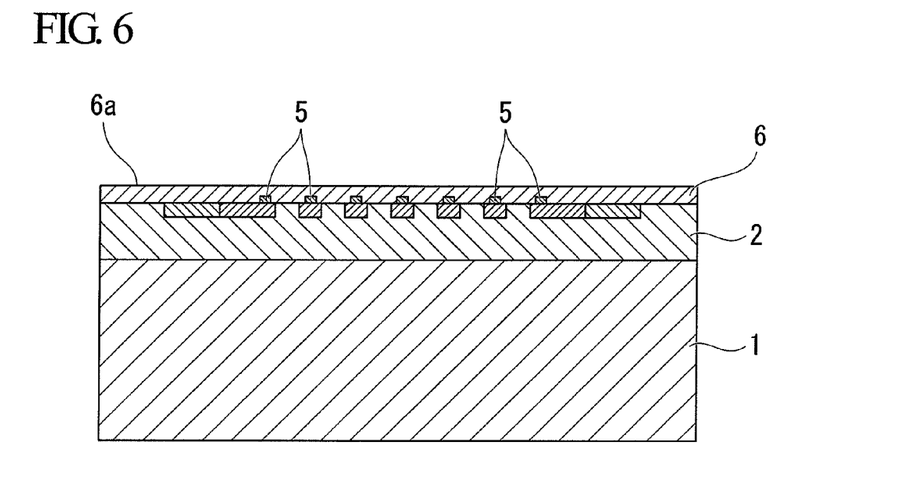
FIG. 6 is a cross sectional process drawing for describing a method of producing a Schottky barrier diode according to the present embodiment.

The protective film 6 constituted of, for example, a silicon oxide (SiO$_2$) film is formed by the CVD method on top of the N-type epitaxial layer 2 in which the ohmic contact electrode 5 has been formed.

Then, planarization of the protective film 6 is carried out by a chemical mechanical polishing (CMP) method. FIG. 6 is a cross sectional process thawing showing a state at this point. It should be noted that this protective film planarization step may not be performed.

<Back Surface Ohmic Contact Electrode Formation Step>

Figure 7:
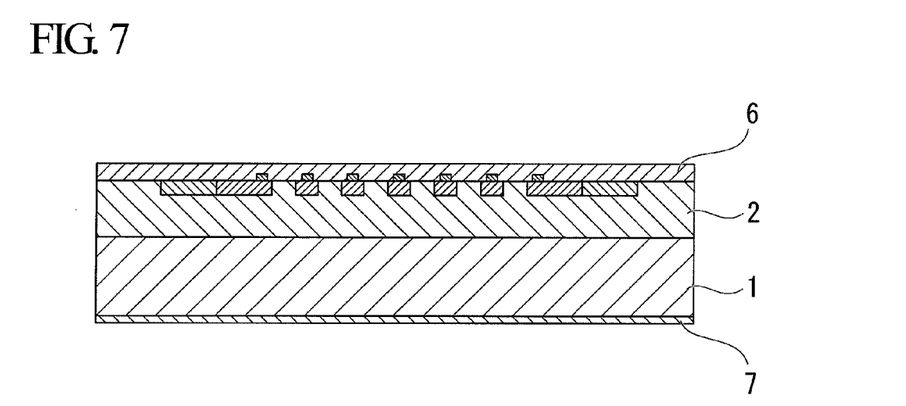
FIG. 7 is a cross sectional process drawing for describing a method of producing a Schottky barrier diode according to the present embodiment.

By employing a sputtering method or a deposition method, a metal film composed of, for example, Ni is formed on the back surface of the SiC single crystal substrate 1 in which the P-type impurity regions 3 and 4 have been formed.

Then, a heat treatment (for example, a heat treatment at 950° C.) is carried out in an inert gas atmosphere or in a vacuum to form the back surface ohmic contact electrode 7. As a result, the back surface ohmic contact electrode 7 forms a favorable ohmic contact with the back surface of the SiC single crystal substrate 1. FIG. 7 is a cross sectional process drawing showing a state at this point.

Figure 8:
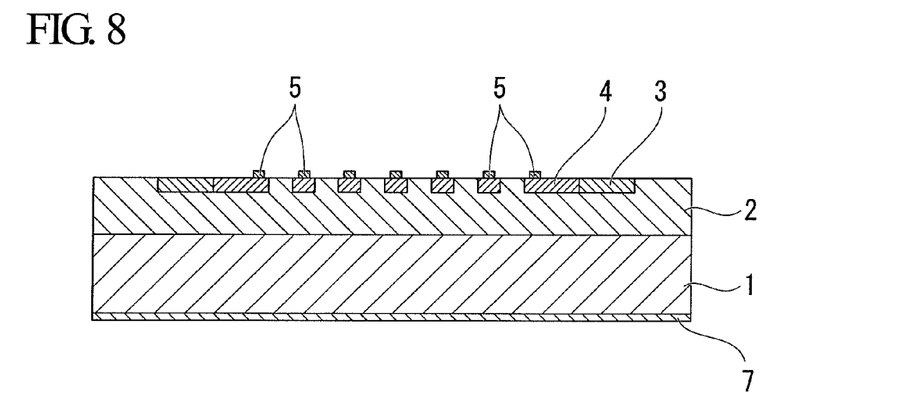
FIG. 8 is a cross sectional process drawing for describing a method of producing a Schottky barrier diode according to the present embodiment.

Subsequently, as shown in FIG. 8, the protective film 6 is removed.

<Front Surface Schottky Contact Electrode Formation Step>

Then, a resist is applied on top of the N-type epitaxial layer 2 in which the ohmic contact electrode 5 has been formed, followed by formation of a photoresist pattern.

Then, by employing a sputtering method or a deposition method, a metal film composed of, for example, titanium, molybdenum, or the like is formed on top of the resist in which the window portion has been formed.

Subsequently, by removing (lifting off) the aforementioned resist, only the metal film formed in the window portion can be left intact so as to cover the ohmic contact electrode 5.

Figure 9:
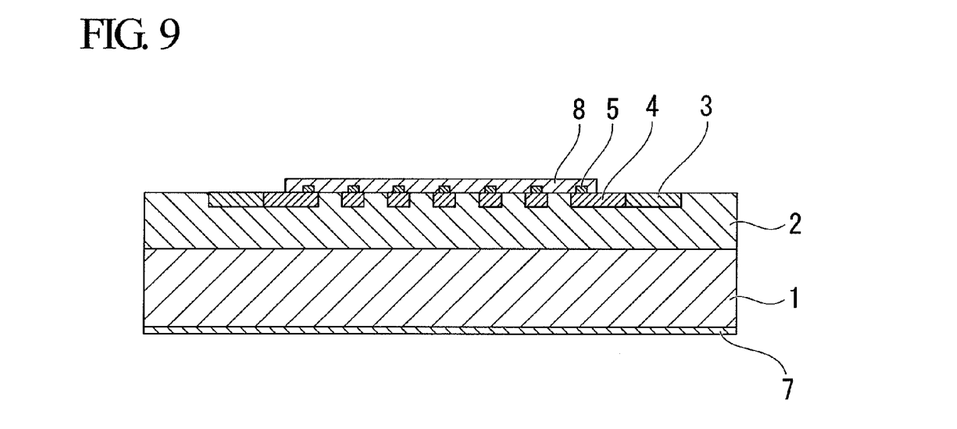
FIG. 9 is a cross sectional process drawing for describing a method of producing a Schottky barrier diode according to the present embodiment.

Then, a heat treatment (for example, a heat treatment at 600° C.) for the Schottky barrier control is carried out in an inert gas atmosphere, thereby forming the Schottky metallic portion 8. The Schottky metallic portion 8 is connected to the SiC single crystal substrate 1, thereby forming a Schottky contact. FIG. 9 is a cross sectional process drawing showing a state at this point.

<Front Surface Pad Electrode Formation Step>

Then, a resist is applied on top of the N-type epitaxial layer 2 in which the Schottky metallic portion 8 has been formed, followed by formation of a photoresist pattern through exposure and development.

Then, by employing a sputtering method, a metal film composed of, for example, aluminum is formed on top of the resist in which the window portion has been formed.

Subsequently, by removing (lifting off) the aforementioned resist, only the metal film formed in the window portion can be left intact so as to cover the Schottky metallic portion 8.

Figure 10:
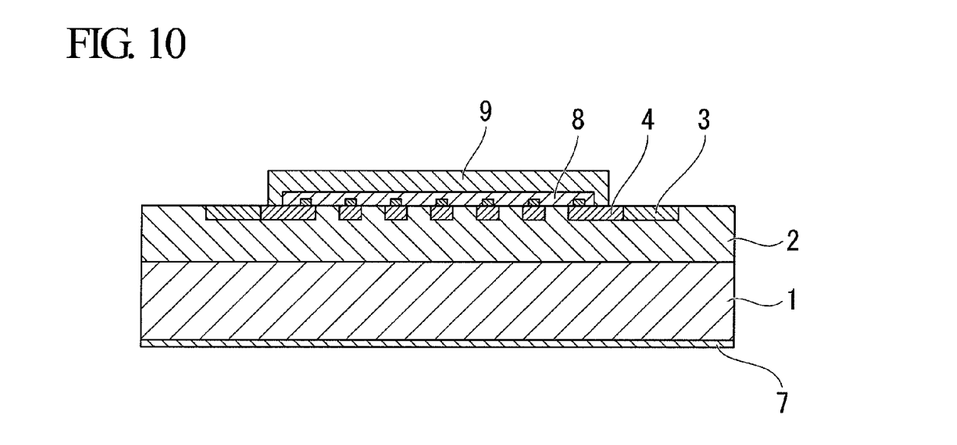
FIG. 10 is a cross sectional process drawing for describing a method of producing a Schottky barrier diode according to the present embodiment.

As a result, the front surface pad electrode 9 connected to the Schottky metallic portion 8 is formed. FIG. 10 is a cross sectional process drawing showing a state at this point.

Then, a passivation film is applied on top of the N-type epitaxial layer 2 in which the front surface pad electrode 9 has been formed. As a passivation film, for example, a photosensitive polyimide film is used.

Figure 11:
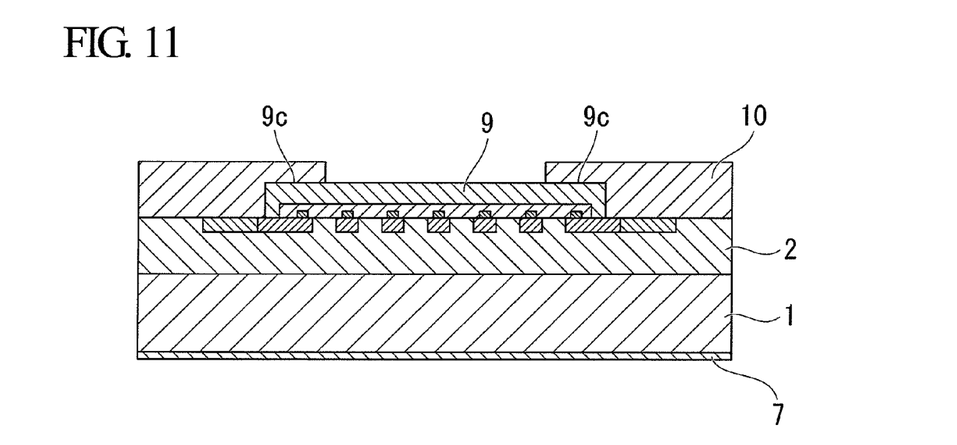
FIG. 11 is a cross sectional process drawing for describing a method of producing a Schottky barrier diode according to the present embodiment.

Then, the patterned passivation film 10 is formed by exposure and development. FIG. 11 is a cross sectional process drawing showing a state at this point. A portion of the surface of the front surface pad electrode 9 is exposed, and the passivation film 10 is formed so as to cover only the end portion 9c of the front surface pad electrode 9.

Lastly, by employing a sputtering method, a two-layered metal film composed of, for example, Ni/Ag or the like is formed as the back surface pad electrode 11 on top of the back surface ohmic contact electrode 7.

The Schottky barrier diode 101 shown in FIG. 1 is prepared by the steps described above.

As described above, the Schottky barrier diode 101 according to the present embodiment is configured so that the front surface ohmic electrode 5 includes an alloy layer containing at least titanium, aluminum and silicon. In addition, this alloy layer has an optimal composition consisting of 40 to 70% by mass of Al, 20 to 50% by mass of Ti and 1 to 15% by mass of Si. For this reason, an ohmic electrode having a low contact resistance and a smooth electrode surface can be provided. Accordingly, even when a treatment using, for example, hydrofluoric acid is conducted following the formation of the front surface ohmic electrode 5, the Schottky barrier diode 101, in which a compact electrode with no gaps within the electrode has been formed, can be provided.

In addition, the front surface ohmic contact electrode 5 includes a two-layer structure constituted of the first alloy layer 5a provided on the P-type impurity region 4 side and the second alloy layer 5b provided on the side opposite to the P-type impurity region 4 while being interposed by the first alloy layer 5a. The front surface ohmic contact electrode 5 as described above where the two-layer structure is observed during the cross sectional observation of electrodes is an electrode exhibiting superior ohmic properties as well as favorable surface conditions.

According to the method of producing a Schottky barrier diode 101 of the present embodiment, in the formation of the front surface ohmic electrode 5, titanium is laminated in a layered manner to form the titanium layer 15a, followed by lamination of aluminum in a layered manner to form the aluminum layer 15b. In addition, it is configured so that a treatment is conducted for 5 minutes at a temperature of 880 to 930° C., which is lower than the usual heat treatment temperature of 1,000° C. adopted for forming ohmic electrodes. As described above, by specifying the lamination order and heat treatment conditions, the front surface ohmic electrode 5 with a desired composition can be formed. Accordingly, the Schottky barrier diode 101 equipped with an ohmic electrode that has a low contact resistance and a smooth electrode surface can be stably produced.

It should be noted that the technical scope of the present invention is not limited to the above-mentioned embodiment, and various modifications can be made without departing from the spirit and scope of the present invention. For example, in the present embodiment, it is not limited to the individual Schottky barrier diode, and field-effect transistors (FET), integrated devices or the like which contain a Schottky barrier as a constituent can also be employed in the same manner.

EXAMPLES

The effects of the present invention will be described below in more detail, based on a series of examples. However, the present invention is in no way limited by these specific examples.

Example 1

First, an N-type epitaxial layer was formed on top of a SiC single crystal substrate. Then, an oxide film was formed on top of the N-type epitaxial layer by the CVD method. Subsequently, a resist was applied on top of the aforementioned oxide film, followed by formation of a photoresist pattern. Thereafter, the aforementioned oxide film was dry etched to form a window portion. Then, ions of aluminum serving as the P-type impurities were implanted by using, as a mask, the aforementioned oxide film having the window portion formed therein. Thereafter, a resist was applied onto the aforementioned oxide film once again, followed by formation of a photoresist pattern. Subsequently, the aforementioned oxide film was dry etched to form an additional window portion. Then, ions of aluminum or boron serving as the P-type impurities were implanted into the N-type epitaxial layer once again by using, as a mask, the aforementioned oxide film having the window portion formed therein. Then, a heat treatment at 1,700° C. was carried out in an inert gas atmosphere. As a result, a low-concentration P-type impurity region and a high-concentration P-type impurity region were formed.

Then, Ti was deposited by a sputtering method to form a film with a film thickness of 60 nm on top of the N-type epitaxial layer having the P-type impurity regions formed therein. Subsequently, Al was deposited on top of the Ti film to form a film with a film thickness of 100 nm (49% by mass). Thereafter, a heat treatment at 900° C. was carried out for 5 minutes to form an electrode.

Figure 12:
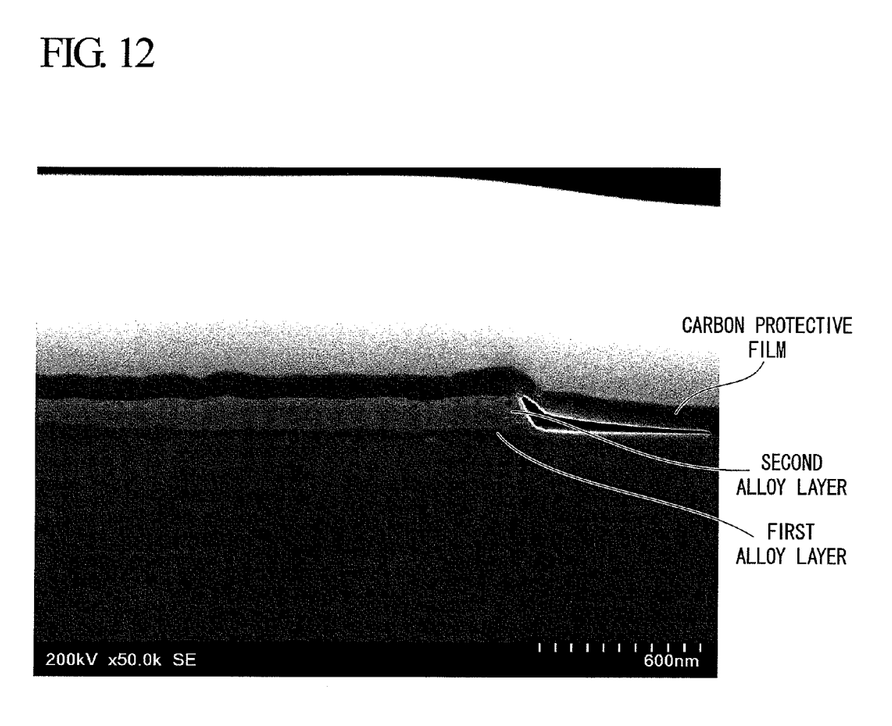
FIG. 12 is a cross sectional TEM photograph showing the vicinity of an electrode obtained in Example 1.

FIG. 12 is a cross sectional TEM photograph showing the vicinity of the electrode obtained in Example 1. As shown in FIG. 12, it was confirmed during the cross sectional observation that the electrode obtained in Example 1 had a two-layer structure constituted of the first alloy layer and the second alloy layer. Note that in FIG. 12, a protective film made of carbon is laminated on top of the electrode for the electron microscope observation.

Figure 13:
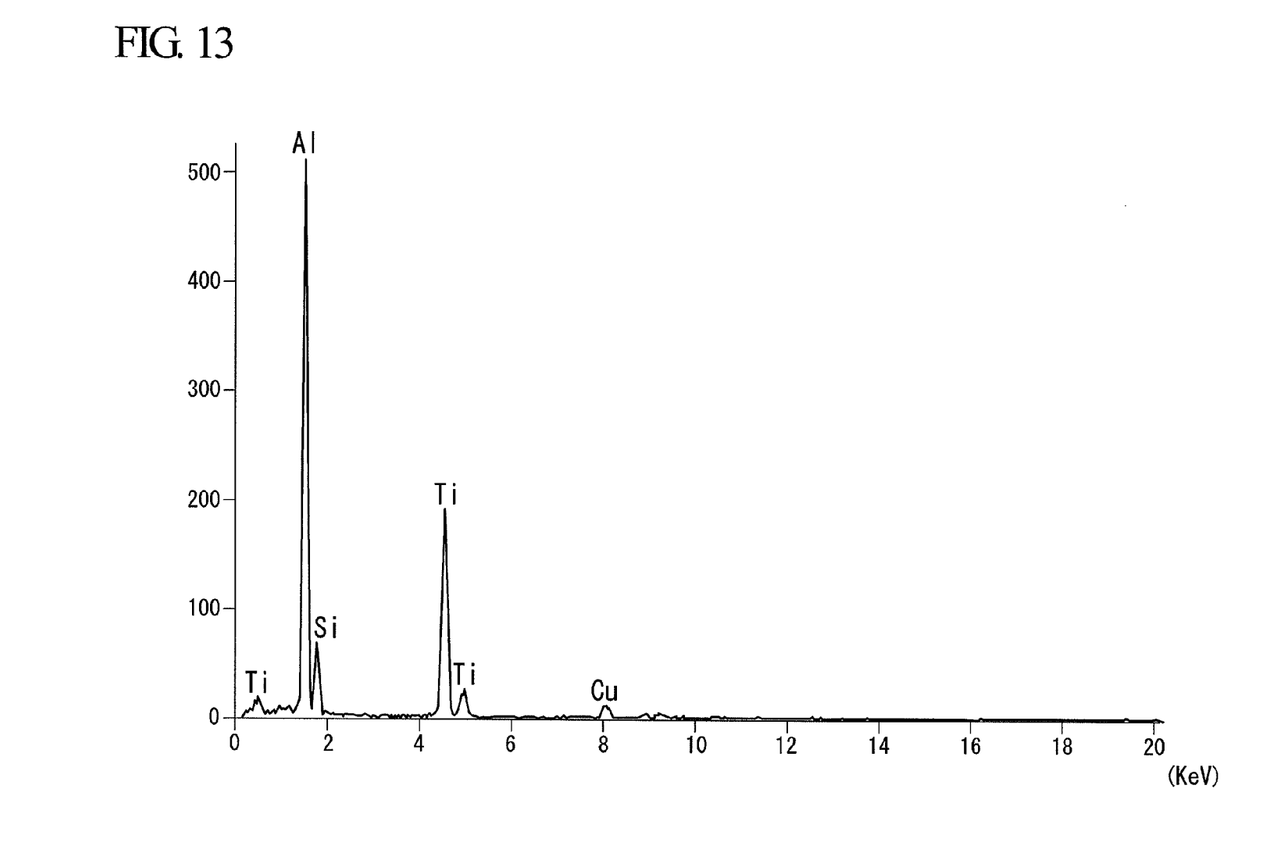
FIG. 13 shows the result of composition analysis by energy dispersive X-ray (EDX) for the electrode obtained in Example 1.

FIG. 13 shows the result of composition analysis by EDX for the electrode obtained in Example 1. As shown in FIG. 13, it was confirmed that the electrode obtained in Example 1 had a ternary composition containing titanium, aluminum and silicon. In addition, the composition of the first alloy layer consisted of 5% by mass of Al, 49% by mass of Ti and 46% by mass of Si. On the other hand, the composition of the second alloy layer consisted of 52% by mass of Al, 41% by mass of Ti and 7% by mass of Si.

Figure 14:
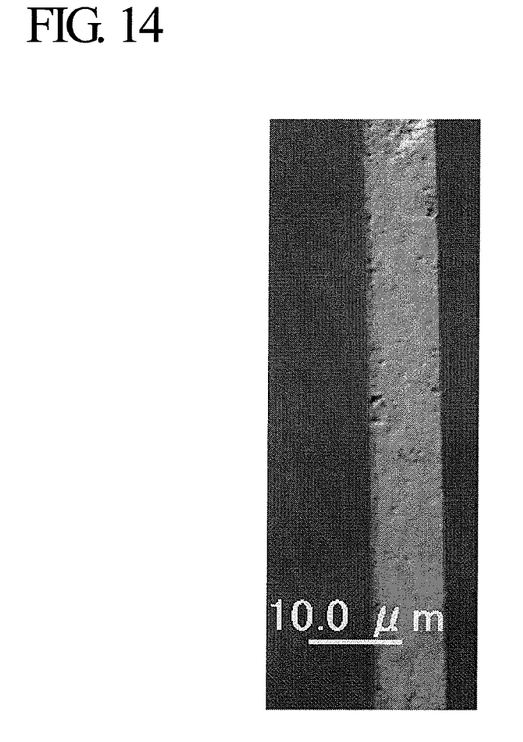
FIG. 14 is a photograph of the surface of the electrode obtained in Example 1.

FIG. 14 is a photograph of the surface of the electrode obtained in Example 1. Here, when the surface conditions for the electrode obtained in Example 1 were evaluated using the surface photograph and an atomic force microscope (AFM), it was confirmed that the electrode surface was smooth.

Note that when a treatment using hydrofluoric acid was conducted on the electrode obtained in Example 1, no gap was observed within the electrode.

In addition, when the contact resistance was measured for the electrode obtained in Example 1, it was $4 \times 10^{-4}$ $\Omega/cm^2$. Therefore, it was confirmed that a superior ohmic electrode was formed in Example 1.

Example 2

With regard to the electrode of Example 2, Ti was deposited by a sputtering method to form a film with a film thickness of 40 nm. Subsequently, Al was deposited on top of the Ti film to form a film with a film thickness of 100 nm (59% by mass). Thereafter, a heat treatment at 900° C. was carried out for 5 minutes to form an electrode.

As a result, the composition of the first alloy layer consisted of 21% by mass of Al, 64% by mass of Ti and 14% by mass of Si. On the other hand, the composition of the second alloy layer consisted of 65% by mass of Al, 27% by mass of Ti and 8% by mass of Si. In addition, the electrode obtained in Example 2 was a superior ohmic electrode with a smooth surface.

Example 3

An MPS-Schottky barrier diode (MPS-SBD) was prepared by applying the P-type electrode of the present invention to a P-type electrode portion.

First, a SiC substrate having an N-type epitaxial layer formed therein was prepared in accordance with the normal SBD preparation method. Then, a P-type ohmic layer and a P-type impurity region that is to become a junction termination extension (JTE) were formed by Al ion implantation and activation annealing on the N-type epitaxial layer side. Further, a silicon carbide wafer having an ohmic electrode formed on the back surface thereof was prepared.

Furthermore, a Ti film was deposited onto a portion that is to become a P-type ohmic electrode in the MPS structure with regard to the composition of Example 2, followed by deposition of an Al film thereon and lifting off to form a P-type ohmic electrode pattern. Then, an annealing treatment was conducted in an argon atmosphere at 900° C. for 5 minutes. Thereafter, a Mo electrode (1.3 mm square) was formed on top of the prepared P-type ohmic electrode, and an annealing treatment was conducted in an argon atmosphere at 650° C. for 5 minutes, thereby preparing a Schottky diode having an MPS structure.

With respect to the Schottky diode obtained in Example 3, the surface of the P-type ohmic electrode was flat and was thus satisfactory. In addition, the measured surge resistance in the forward direction showed a favorable value of 72 A, thereby confirming that the P-type portion having the prepared P-type electrode was functioning as a superior ohmic electrode.

Example 4

In Example 4, an electrode was formed by changing the heat treatment conditions for the electrode described above in Example 2.

More specifically, with regard to the electrode of Example 4, Ti was deposited by a sputtering method to form a film with a film thickness of 40 nm. Subsequently, Al was deposited on top of the Ti film to form a film with a film thickness of 100 nm (59% by mass). Thereafter, a heat treatment at 880° C. was carried out for 5 minutes to form an electrode.

As a result, the composition of the first alloy layer in the electrode of Example 4 consisted of 23% by mass of Al, 74% by mass of Ti and 3% by mass of Si. On the other hand, the composition of the second alloy layer consisted of 68% by mass of Al, 30% by mass of Ti and 2% by mass of Si. In addition, the electrode obtained in Example 4 was a superior ohmic electrode with a smooth surface.

Example 5

In Example 5, an electrode was formed by changing the heat treatment conditions for the electrode described above in Example 2.

More specifically, with regard to the electrode of Example 5, Ti was deposited by a sputtering method to form a film with a film thickness of 40 nm. Subsequently, Al was deposited on top of the Ti film to form a film with a film thickness of 100 nm (59% by mass). Thereafter, a heat treatment at 930° C. was carried out for 5 minutes to form an electrode.

As a result, the composition of the first alloy layer in the electrode of Example 5 consisted of 19% by mass of Al, 71% by mass of Ti and 15% by mass of Si. On the other hand, the composition of the second alloy layer consisted of 69% by mass of Al, 20% by mass of Ti and 11% by mass of Si. In addition, the electrode obtained in Example 5 was a superior ohmic electrode with a smooth surface.

Comparative Example 1

An electrode was prepared by laminating layers composed of 40 nm of Ti, 50 nm of Al and 20 nm of Si on top of a SiC single crystal substrate, followed by a heat treatment at 900° C. for 5 minutes. When the composition of this electrode was examined, the composition of the first alloy layer consisted of 3% by mass of Al, 45% by mass of Ti and 52% by mass of Si. On the other hand, the composition of the second alloy layer consisted of 30% by mass of Al, 33% by mass of Ti and 37% by mass of Si. In addition, the electrode obtained in Comparative Example 1 did not exhibit ohmic properties.

Comparative Example 2

An electrode was prepared by laminating layers composed of 40 nm of Ti and 100 nm of Al (59% by mass) on top of a SiC single crystal substrate, followed by a heat treatment at 950° C. for 5 minutes. When the composition of this electrode was examined, the composition of the first alloy layer consisted of 1% by mass of Al, 81% by mass of Ti and 18% by mass of Si. On the other hand, the composition of the second alloy layer consisted of 93% by mass of Al, 1% by mass of Ti and 6% by mass of Si. In addition, the electrode obtained in Comparative Example 2 had a rough surface.

Comparative Example 3

An electrode was prepared by laminating layers composed of 40 nm of Ti and 100 nm of Al (59% by mass) on top of a SiC single crystal substrate, followed by a heat treatment at 800° C. for 5 minutes. When the composition of this electrode was examined, the composition of the first alloy layer consisted of 32% by mass of Al, 67% by mass of Ti and 1% by mass of Si.

On the other hand, the composition of the second alloy layer consisted of 35% by mass of Al, 65% by mass of Ti and 0% by mass of Si. In addition, the electrode obtained in Comparative Example 3 did not exhibit ohmic properties.

Comparative Example 4

An electrode was prepared by laminating layers composed of 40 nm of Ti and 100 nm of Al (59% by mass) on top of a SiC single crystal substrate, followed by a heat treatment at 900° C. for 10 minutes. When the composition of this electrode was examined, the composition of the first alloy layer consisted of 20% by mass of Al, 65% by mass of Ti and 15% by mass of Si. On the other hand, the composition of the second alloy layer consisted of 62% by mass of Al, 29% by mass of Ti and 9% by mass of Si. In addition, the electrode obtained in Comparative Example 4 had a rough surface.

Industrial Applicability

The present invention can be applied to a silicon carbide semiconductor device, and also to a method of producing a silicon carbide semiconductor device.

Reference Signs List

1: SiC single crystal substrate
2: N-type epitaxial layer
3, 4: P-type impurity region (p-type silicon carbide single crystal)
5: Front surface ohmic contact electrode (ohmic electrode)
5a: First alloy layer
5b: Second alloy layer
6: Protective film
7: Back surface ohmic contact electrode
8: Schottky metallic portion
9: Front surface pad electrode
10: Passivation film
11: Back surface pad electrode
15a: Titanium layer
15b: Aluminum layer
101: Schottky barrier diode (silicon carbide semiconductor device)

The invention claimed is:
1. A silicon carbide semiconductor device comprising:
a p-type silicon carbide single crystal; and
an ohmic electrode for the p-type silicon carbide single crystal;
wherein the ohmic electrode includes an alloy layer containing at least titanium, aluminum and silicon,
ratios of titanium, aluminum, and silicon in the alloy layer are Al: 40 to 70% by mass, Ti: 20 to 50% by mass, and Si: 1 to 15% by mass.
the alloy layer includes a two-layer structure consisted of a first alloy layer provided on the p-type silicon carbide single crystal side and a second alloy layer provided on the side opposite to the p-type silicon carbide single crystal while being interposed by the first alloy layer,
the alloy layer is formed by laminating titanium on top of the silicon carbide single crystal in a layered manner, and then laminating aluminum thereon in a layered manner, followed by alloying through a heat treatment which is conducted at a temperature between 880 and 930 ° C and within a time of 5 minutes, and
a concentration of silicon in the first alloy layer is higher than a concentration of silicon in the second alloy layer.

2. A method of producing the silicon carbide semiconductor device as claimed in claim 1, comprising:
- a step of laminating titanium on top of a silicon carbide single crystal in a layered manner;
- a step of laminating aluminum, in a layered manner, on the titanium laminated in a layered manner; and
- a step of alloying through a heat treatment,
- wherein the heat treatment is conducted at a temperature between 880 and 930° C and within a time of 5 minutes.

3. The silicon carbide semiconductor device according to claim 1, wherein a concentration of titanium in the first alloy layer is higher than a concentration of aluminum.

\* \* \* \* \*